United States Patent
Santero et al.

(10) Patent No.: US 7,117,852 B2
(45) Date of Patent: Oct. 10, 2006

(54) SINGLE DEVICE FOR CONTROLLING FUEL ELECTRO-INJECTORS AND ELECTROVALVES IN AN INTERNAL-COMBUSTION ENGINE, AND METHOD OF OPERATING THE SAME

(75) Inventors: Paolo Santero, Orbassano (IT); Riccardo Groppo, Orbassano (IT)

(73) Assignee: C.R.F. Societa Consortile per Azioni, (IT)

( * ) Notice: Subject to any disclaimer, the term of this patent is extended or adjusted under 35 U.S.C. 154(b) by 0 days.

(21) Appl. No.: 11/112,745

(22) Filed: Apr. 22, 2005

(65) Prior Publication Data

US 2006/0075994 A1    Apr. 13, 2006

(30) Foreign Application Priority Data

Oct. 8, 2004    (EP)    ................... 04425755

(51) Int. Cl.
F02B 57/04    (2006.01)
(52) U.S. Cl. ..................... 123/490; 123/90.11; 123/478
(58) Field of Classification Search ............. 123/90.11, 123/478, 490
See application file for complete search history.

(56) References Cited

U.S. PATENT DOCUMENTS

| | | | |
|---|---|---|---|
| 4,333,434 A * | 6/1982 | Brunais et al. ............. | 123/478 |
| 4,479,161 A * | 10/1984 | Henrich et al. ............. | 361/154 |
| 6,175,484 B1 * | 1/2001 | Caruthers et al. ........... | 361/154 |
| 6,526,945 B1 * | 3/2003 | Herzog et al. .............. | 123/490 |
| 6,772,737 B1 * | 8/2004 | Gaessler et al. ............ | 123/490 |
| 2006/0011157 A1 * | 1/2006 | Flohr ....................... | 123/90.11 |

FOREIGN PATENT DOCUMENTS

| | | |
|---|---|---|
| EP | 1010867 A1 | 6/2000 |
| EP | 1152309 A1 | 11/2001 |
| FR | 2766005 | 1/1999 |
| JP | 10131726 | 5/1998 |

* cited by examiner

Primary Examiner—Erick R Solis
(74) Attorney, Agent, or Firm—Sheridan Ross P.C.

(57) ABSTRACT

In a single device for controlling electro-injectors and electrovalves in an internal-combustion engine, a first control circuit for each electro-injector, a second control circuit for each electrovalve, and a timing circuit, supplying timing signals to the first and second control circuits. In the second control circuit, switches selectively connect the respective electrovalve to a first voltage source in certain given operating conditions, and to a boosted voltage source, constituted by a capacitor for accumulation of energy, in certain other given operating conditions. In this way, part of the electrical energy accumulated in the electrovalve during its normal actuation is transferred to the capacitor, thus causing the latter to be recharged.

32 Claims, 3 Drawing Sheets

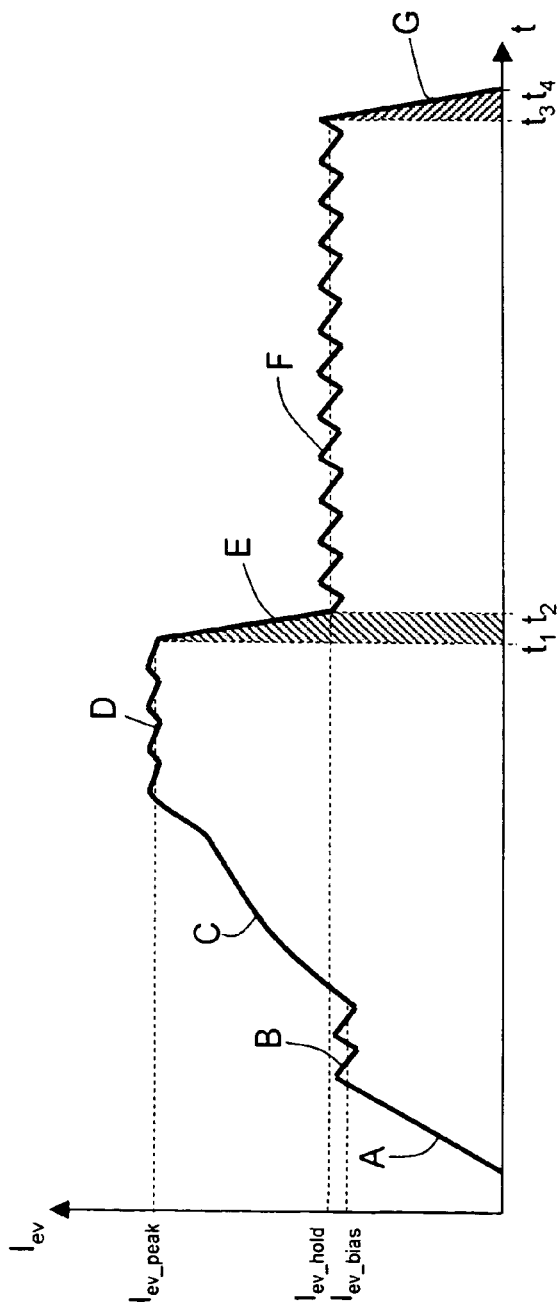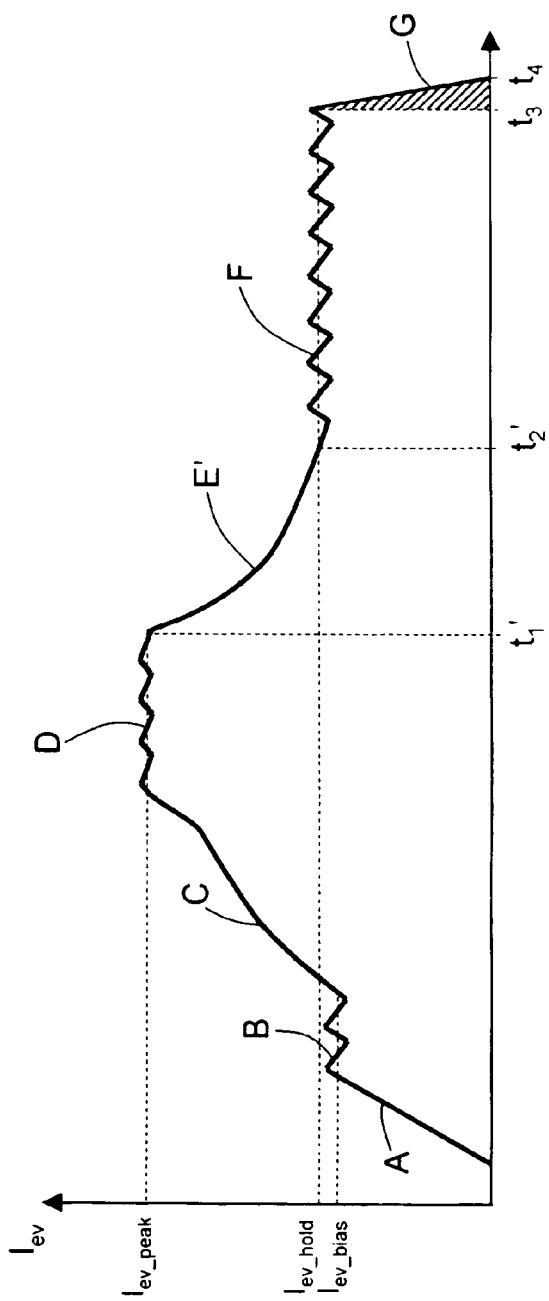

SINGLE DEVICE FOR CONTROLLING FUEL ELECTRO-INJECTORS AND ELECTROVALVES IN AN INTERNAL-COMBUSTION ENGINE, AND METHOD OF OPERATING THE SAME

This application claims priority pursuant to 35 USC § 119 to European Patent Application No. 04425755, filed Oct. 8, 2004, which is incorporated by reference in its entirety herein.

FIELD OF THE INVENTION

The present invention relates to a single device for controlling fuel electro-injectors and electrovalves in an internal-combustion engine, in particular a diesel engine, provided with a common-rail fuel-injection system and an electrohydraulic system of variable actuation of the intake and/or exhaust valves ("variable valve actuation"). The present invention moreover relates to a method of operating such control device.

BACKGROUND AND SUMMARY OF THE INVENTION

For control of electro-injectors it is known to supply each of them with a current, whose time plot comprises a rise portion increasing up to a first hold value, an amplitude oscillating portion about the first hold value, a fall portion decreasing down to a second hold value, an amplitude oscillating portion about the second hold value, and a fall portion down to an approximately zero value.

For control of electrovalves, for example electrovalves for controlling intake and exhaust valves, it is known to supply each of them with a current, whose time plot comprises a rise portion increasing up to a first hold value, an amplitude oscillating portion about the first hold value, a rise portion increasing up to a second hold value, an amplitude oscillating portion about the second hold value, a fall portion decreasing down to a third hold value, an amplitude oscillating portion about the third hold value, and finally a fall portion decreasing down to an approximately zero value.

Driving of the electrovalves is obtained via a control device comprising, for each electrovalve, a pair of controlled switches, which are arranged in series to the electrovalve, one of which connects the electrovalve to a supply line and the other connects the electrovalve to a ground line; and a free-wheeling diode connected between one of the terminals of the electrovalve and the ground line.

During the decrease of the current from the third hold value to a substantially zero value, both of the controlled switches are simultaneously open and the current circulating in the electrovalve is discharged towards the ground line, through the free-wheeling diode and the controlled switch connected to the ground line. The latter operates in the breakdown region, and dissipated thereon by the avalanche effect is the energy stored in the electrovalve, which is equal to:

$$E = \frac{1}{2} \cdot L_{ev} \cdot I_{ev\_h}^2$$

where $I_{ev\_h}$ is the initial value of the current circulating in the electrovalve, equal to the value reached in the previous step, and $L_{ev}$ is the equivalent inductance of the electrovalve.

By substituting typical numerical values, it is possible to verify immediately that the energy dissipated on the controlled switch is equal to approximately 10 mJ, a value such as to cause a considerable overheating of the controlled switch.

Given that the controlled switches are normally MOSFET transistors, it is thus necessary to use transistors having packages of sufficiently large dimensions as to be able to dissipate the high energy values involved.

Considering a four-cylinder engine, of which at least the two intake valves of each cylinder are controlled, and operating at 3500 r.p.m. with a dual actuation of the electrovalves for each engine rev, a dissipation of power equal to approximately 4.7 W is obtained on the basis of the previously calculated value, only due to the avalanche effect in the controlled switches. To said value the power dissipated by conduction during actuation of the electrovalves is then to be summed.

Driving of the electro-injectors is obtained via a control device having a circuit architecture similar to the one used for driving the electrovalves, so that the integration in the same engine control unit of both of the devices for controlling the electrovalves and the electro-injectors leads to considerable problems linked principally to the dissipation of the high powers involved and to the integration in reduced dimensions of all the electronic components.

Currently, the problems linked to the high dissipation of power in the engine control unit are overcome by resorting to costly technologies, which envisage, among other things, the use of ceramic substrates or hybrid circuits.

The purpose of the present invention is thus to provide a single device for controlling electro-injectors and electrovalves that will enable the above drawbacks to be overcome.

According to the present invention, a single device for controlling electro-injectors and electrovalves, and a method of operating the same are consequently provided, as defined in claims 1 and 11, respectively.

BRIEF DESCRIPTION OF THE DRAWINGS

For a better understanding of the present invention, there is now described a preferred embodiment, provided purely by way of non-limiting example and with reference to the attached drawings, wherein:

FIGS. 2–6 show time graphs of some electrical quantities of the circuit of FIG. 1, in various operating conditions.

DETAILED DESCRIPTION

Figure 1:
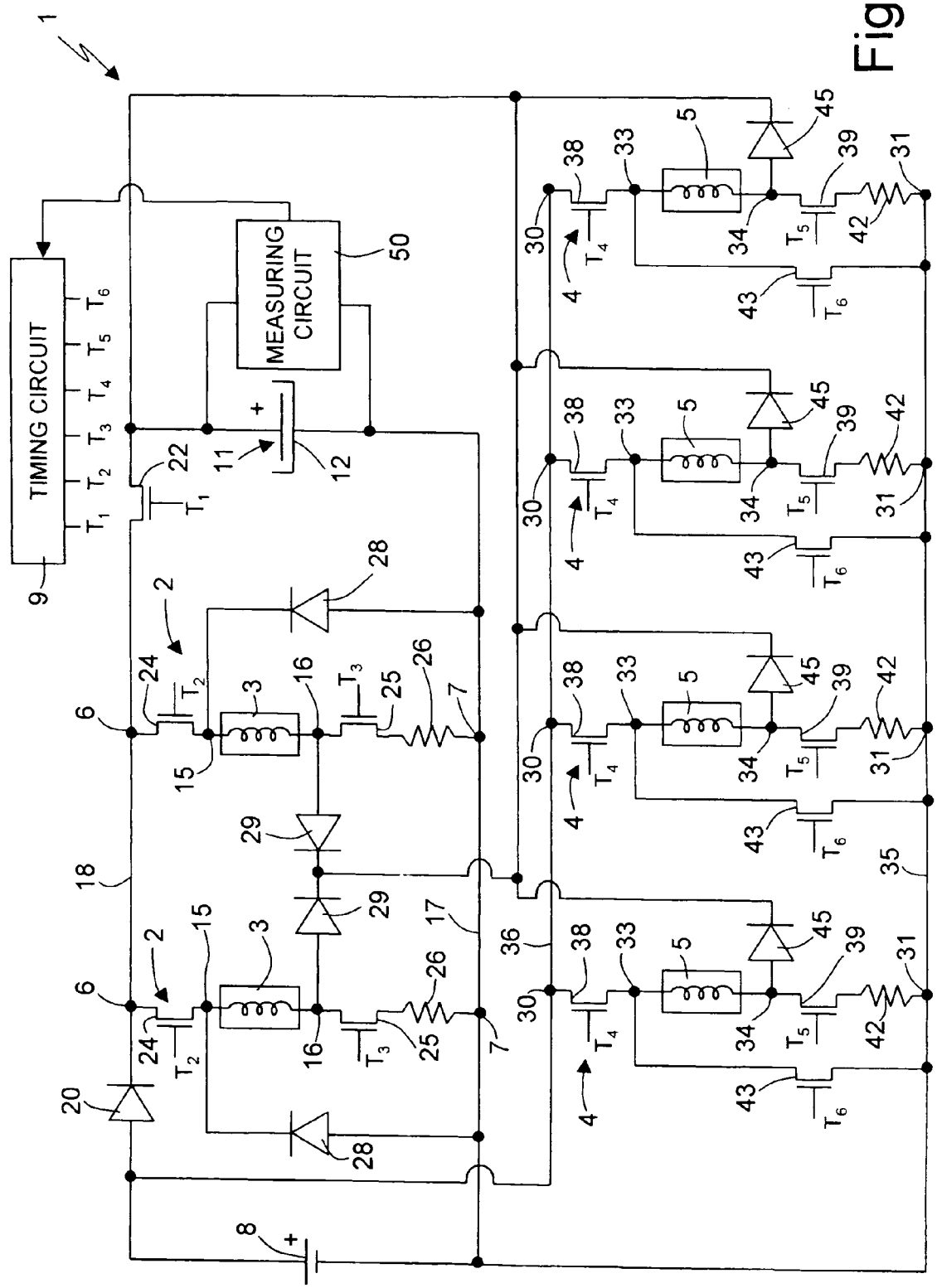
FIG. 1 shows a circuit embodiment of a single device for controlling electro-injectors and electrovalves according to the present invention.

A single device for controlling electro-injectors and electrovalves according to the invention is illustrated in FIG. 1 and designated as a whole by the reference number 1.

For simplicity of representation and description, FIG. 1 illustrates just the parts of the device 1 regarding one cylinder bank of the engine (not illustrated), constituted by two cylinders, wherein an electro-injector, two intake valves, and two exhaust valves are associated to each cylinder. In addition, FIG. 1 shows the parts of the device 1 regarding control of the electrovalves for controlling the just four intake valves in the cylinder bank.

According to what is illustrated in FIG. 1, the device 1 comprises a plurality of first control circuits 2, one for each electro-injector 3, a plurality of second control circuits 4, one for each electrovalve 5, and a timing circuit 9, designed to supply control signals to the first and second control circuits 2, 4.

In FIG. 1, each electro-injector 3 is represented with its corresponding equivalent induction coil (with inductance $L_{INJ}$), and the four electrovalves 5 are represented with the corresponding equivalent induction coil (with inductance $L_{ev}$).

In detail, each first control circuit 2 comprises a first input terminal 6 and a second input terminal 7, connected, respectively, to the positive pole of a supply source 8 via a battery diode 20 and to the negative pole of the supply source 8. The supply source 8 can be the battery of the motor vehicle, which supplies a voltage $V_{BATT}$, the nominal value of which is typically 13.5 V. The battery diode 20 has its anode connected to the positive pole of the supply source 8 and its cathode connected to the first input terminal 6.

The first and second input terminals 6, 7 are moreover connected, respectively, to the positive pole and to the negative pole of a voltage-boosting circuit 11, which supplies a boosted voltage $V_{BOOST}$, higher than the battery voltage $V_{BATT}$, for example equal to 50 V. In its simplest embodiment, the voltage-boosting circuit 11 is made up by a single capacitor 12, referred to as "boost capacitor", but possibly, in particular applications, the use of a DC/DC converter (not illustrated) connected in parallel to the capacitor 12 may be envisaged. A measuring circuit 50, arranged in parallel to the capacitor 12, measures the voltage across the capacitor 12, which coincides with the boosted voltage $V_{BOOST}$, and is connected to the timing circuit 9.

In particular, the first input terminal 6 is connected to the positive pole of the voltage-boosting circuit 11 via a boost transistor 22, of a MOSFET type, having its gate terminal receiving a first control signal T1 from the timing circuit 9, its drain terminal connected to the positive pole of the voltage-boosting circuit 11, and its source terminal connected to the first input terminal 6.

Each first control circuit 2 further comprises a first output terminal 15 and a second output terminal 16; a corresponding electro-injector 3 is connected between these terminals. In particular, the terminal of each electro-injector 3 connected to the first output terminal 15 is typically called "highside" (HS) terminal or hot-side terminal, whilst the terminal of each electro-injector 3 connected to the second output terminal 16 is typically called "lowside" (LS) terminal or cold-side terminal.

A supply line 18 and a ground line 17 connect to one another the first input terminals 6 and the second input terminals 7 respectively, of the first control circuits 2.

Each first control circuit 2 further comprises: a highside transistor 24, of a MOSFET type, having its gate terminal receiving a second control signal T2 from the timing circuit 9, its drain terminal connected to the supply line 18, and its source terminal connected to the first output terminal 15; and a lowside transistor 25, which is also of a MOSFET type, having its gate terminal receiving a third control signal T3 from the timing circuit 9, its drain terminal connected to the second output terminal 16, and its source terminal connected to the ground line 17 through a sense stage. The sense stage is formed by a sense resistor 26, across which, in a known way, there is connected an operational amplifier (not illustrated), which outputs a voltage proportional to the current flowing in the sense resistor 26.

Finally, each first control circuit 2 comprises: a free-wheeling diode 28, having its anode connected to the ground line 17 and its cathode connected to the first output terminal 15; and a boost diode 29, having its anode connected to the second output terminal 16 and its cathode connected to the positive pole of the voltage-boosting circuit 11. In particular, the free-wheeling diode 28 can alternatively be replaced by a MOS transistor (not illustrated) having the function of synchronous rectifier.

Each second control circuit 4 has a circuit structure similar to the first control circuit 2 described previously.

In detail, each second control circuit 4 has: a first input terminal 30 and a second input terminal 31, connected, respectively, to the positive pole and to the negative pole of the supply source 8; and a first output terminal 33 and a second output terminal 34, between which there is connected a corresponding electrovalve 5.

A supply line 36 and a ground line 35 connect to one another, respectively, the first input terminals 30 and the second input terminals 31 of the second control circuits 4.

Each second control circuit 4 further comprises a highside transistor 38, of a MOSFET type, and a lowside transistor 39, which is also of a MOSFET type. In particular, the highside transistor 38 has its gate terminal receiving a fourth control signal T4 from the timing circuit 9, its drain terminal connected to the supply line 36, and its source terminal connected to the first output terminal 33. The lowside transistor 39 has its gate terminal receiving a fifth control signal T5 from the timing circuit 9, its drain terminal connected to the second output terminal 34, and its source terminal connected to the ground line 35 through a sense stage. The sense stage is formed by a sense resistor 42, across which, in a known way, are connected the inputs of an operational amplifier (not illustrated), which outputs a voltage proportional to the current flowing in the sense resistor 42.

Finally, each second control circuit 4 comprises: a free-wheeling transistor 43, of a MOSFET type, having its source terminal connected to the ground line 35, its drain terminal connected to the first output terminal 33, and its gate terminal receiving a sixth control signal T6 from the timing circuit 9; and a boost diode 45, having its anode connected to the second output terminal 34 and its cathode connected to the positive pole of the voltage-boosting circuit 11, at the boosted voltage $V_{BOOST}$. In particular, the free-wheeling transistor 43 can alternatively be replaced by a free-wheeling diode (not illustrated).

To be noted in particular is the presence in the second control circuit 4 of the boost diode 45 connected to the voltage-boosting circuit 11. It will be seen from what follows that the presence of said component contributes to solve the problems of power dissipation in the lowside transistor, described with reference to the known art.

The operation of each first control circuit 2 envisages different operating modes, characterized by a different pattern of the current flowing in the respective electro-injector 3: a fast-charge mode, in which the current increases until it reaches a given hold value; a hold mode, in which the current oscillates with an approximately sawtooth waveform around the value reached in the previous step; and a fast-discharge mode, in which the current decreases from the value assumed in the previous step down to a final value, which may also be zero. In particular, the aforesaid modes concur in injecting fuel into the cylinders.

Figure 2:
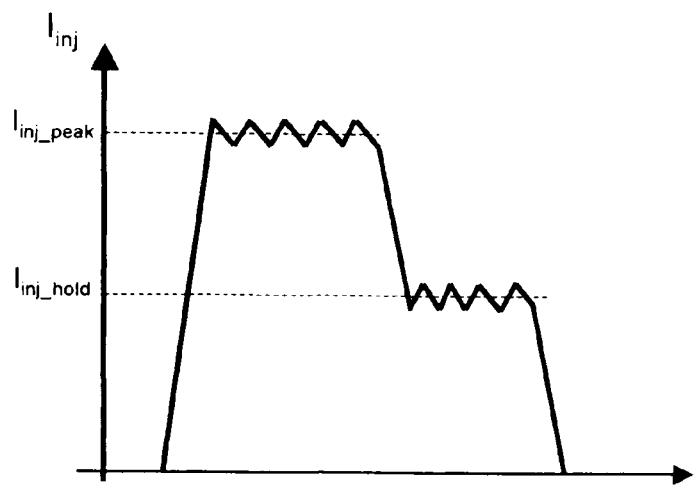

FIG. 2 illustrates, by way of example, a possible time graph of the current flowing in an electro-injector 3, designated by $I_{inj}$, obtained via the alternation and repetition of the three operating modes referred to above. In particular, said possible time graph comprises: a first rise portion increasing up to a peak value, designated by $I_{inj\_peak}$; a first hold portion, in which the amplitude of the current oscillates about the peak value; a first fall portion decreasing down to a hold value, designated by $I_{inj\_hold}$; a second hold portion, with amplitude oscillating about the hold value; and a second fall portion decreasing down to an approximately zero value.

In detail, during the fast-charge mode the transistors 22, 24 and 25 are in a closed condition, and thus the boosted voltage $V_{BOOST}$ is applied across the electro-injector 3. The current consequently flows in the loop comprising the capacitor 12, the boost transistor 22, the highside transistor 24, the electro-injector 3, the lowside transistor 25, and the sense resistor 26, increasing in time in an approximately linear way with a slope equal to $V_{BOOST}/L_{inj}$.

During the hold mode, the lowside transistor 25 is in a closed condition; the boost transistor 22 is in an open condition, and the highside transistor 24 is set repeatedly in a closed condition and in an open condition, and thus across the electro-injector 3 there are alternately applied the battery voltage $V_{BATT}$ (when the highside transistor 24 is in a closed condition) and an approximately zero voltage (when the highside transistor 24 is in an open condition). In the first case (highside transistor 24 in a closed condition), the current flows in the loop comprising the supply source 8, the battery diode 20, the highside transistor 24, the electro-injector 3, the lowside transistor 25, and the sense resistor 26, increasing in time in a substantially exponential way, whilst in the second case (highside transistor 24 in an open condition), the current flows in the loop comprising the electro-injector 3, the lowside transistor 25, the sense resistor 26, and the free-wheeling diode 28, decreasing in time in a substantially exponential way.

Finally, in the fast-discharge mode the transistors 22, 24 and 25 are in an open condition and thus, as long as the electro-injector 3 is traversed by current, across the electro-injector 3 there is applied the inverted boosted voltage $-V_{BOOST}$. The current flows in the loop comprising the capacitor 12, the boost diode 29, the electro-injector 3, and the free-wheeling diode 28, decreasing in time in a substantially linear way with a slope equal to $-V_{BOOST}/L_{inj}$. In this step, the electrical energy in the electro-injector 3 (given by $$E = \frac{1}{2} \cdot L_{inj} \cdot I_{inj\_hold}^2 )$$

is transferred to the capacitor 12, so as to recover part of the energy supplied during the charge step, thus increasing the efficiency of the system.

In all of the operating modes (i.e., the fast-charge, hold, and fast-discharge modes), the opening and closing of the transistors 22, 24 and 25 are controlled by the timing circuit 9 on the basis of the value of the current flowing in the electro-injector 3, detected via the sense resistor 26 (closed-loop control), or else are controlled according to circuit calculations (open-loop control).

In particular, during the hold mode the highside transistor 24 is controlled in PWM by the corresponding control signal T2, which is constituted by a pulse train with a period and duty cycle which can be regulated in open-loop control or closed-loop control by the timing circuit 9 for maintaining the current in the electro-injector 3 around the respective hold value.

A further operating mode, referred to as recharge mode, is moreover provided for each first control circuit 2. In particular, the recharge mode enables recharging of the capacitor 12 using one or more non-operative electro-injectors 3, i.e., ones not involved in a fuel injection. In this way, it is possible to generate the boosted voltage $V_{BOOST}$ also without a dedicated DC/DC converter.

Figure 3:
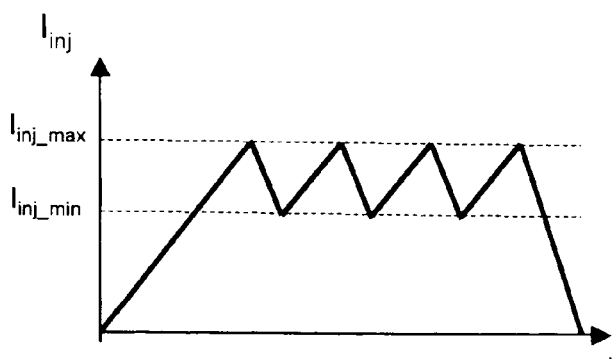

In detail, when the boosted voltage $V_{BOOST}$ across the capacitor 12, on account of the injections of fuel, drops below a given lower limit (for example, 49 V), first the electro-injector or the electro-injectors 3 not used at that given instant for fuel injection are identified, and then each of these is used for recharging the capacitor 12. The waveform of the current $I_{inj}$ flowing in the electro-injector during the recharge step is illustrated in FIG. 3.

The maximum level of the current in the electro-injector 3 during the recharge step, designated by $I_{inj\_max}$, must evidently be lower than the minimum current necessary for opening the electro-injector, in such a way as to prevent undesired injections of fuel.

In particular, during recharging of the capacitor 12, the boost transistor 22 is always kept in an open condition, the highside transistor 24 is always kept in a closed condition, whilst the lowside transistor 25 is set repeatedly in a closed condition and in an open condition.

When the lowside transistor 25 is in a closed condition, the current flows in the loop comprising the supply source 8, the battery diode 20, the highside transistor 24, the electro-injector 3, the lowside transistor 25, and the sense resistor 26, increasing in an approximately linear way with a slope equal to $V_{BATT}/L_{inj}$.

During this step (corresponding to the rise portions of the curve of FIG. 3), across the electro-injector 3 there is present the voltage $V_{BATT}$, and the electrical energy coming from the supply source 8 is transferred to the electro-injector 3 and accumulated in the latter. This step terminates when the current in the electro-injector 3 reaches the pre-set maximum value $I_{inj\_max}$.

When, instead, the lowside transistor 25 is in an open condition, the current flows in the loop comprising the supply source 8, the battery diode 20, the highside transistor 24, the electro-injector 3, the boost diode 29, and the capacitor 12, decreasing in a substantially linear way with a slope equal to $(V_{BATT}-V_{BOOST})/L_{inj}$, until a given lower limit $I_{inj\_min}$, which may even be zero, is reached.

During this step (corresponding to the fall portions of the curve of FIG. 3), the electrical energy accumulated in the electro-injector 3 is transferred to the capacitor 12, thus determining its recharge.

The operation of each second control circuit 4 is now described.

Similarly to what described for the first control circuit 2, different operating modes are envisaged: the charge mode, in which the current increases up to a given hold value; the hold mode, in which the current oscillates with an approximately sawtooth waveform around the value reached in the previous step; and the discharge mode, in which the current decreases from the value assumed in the previous step down to a final value, which may even be zero. Through the alternation and repetition of the three aforesaid modes, it is possible to supply to each electrovalve 5 a current $I_{ev}$, a possible time graph of which is illustrated in FIG. 4 and comprises: a first rise portion A increasing up to a first hold value $I_{ev\_bias}$; a first hold portion B, in which the amplitude of the current oscillates about the first hold value; a second rise portion C increasing up to a peak value $I_{ev\_peak}$; a second hold portion D, with an amplitude oscillating about the peak value; a first fall portion E decreasing down to a third hold value $I_{ev\_hold}$; a third hold portion F, with an amplitude oscillating about the third hold value; and finally, a second fall portion G, decreasing down to an approximately zero value.

In detail, during the charge mode (portions A and C), the highside and lowside transistors 38 and 39 are kept in a closed condition by the respective control signals T4 and T5, and thus across the electrovalve 5 there is applied the battery voltage $V_{BATT}$. In this way, the current flows in the loop comprising the supply source 8, the highside transistor 38, the electrovalve 5, the lowside transistor 39, and the sense resistor 42, increasing in time in a substantially exponential way.

In the hold mode (portions B, D and F), the lowside transistor 39 is kept in a closed condition, whilst the highside transistor 38 is set repeatedly in a closed condition and in an open condition, and thus across the electrovalve 5 there are alternately applied the battery voltage $V_{BATT}$ (when the highside transistor 38 is in a closed condition) and a zero voltage (when the highside transistor 38 is in an open condition).

In the first case (highside transistor 38 in a closed condition), the electrovalve 5 absorbs energy from the supply source 8, and the current flows in the loop comprising the supply source 8, the highside transistor 38, the electrovalve 5, the lowside transistor 39, and the sense resistor 42, increasing in time. In the second case, instead (highside transistor 38 in an open condition), the electrovalve 5 yields energy, and the current flows in the loop comprising the electrovalve 5, the lowside transistor 39, the sense resistor 42, and the free-wheeling transistor 43, decreasing in time in an approximately linear way.

The operation of the second control circuit 4 during the discharge mode, and the circuit embodiment described, prevent high levels of power dissipation, ensuring at the same time a more effective recharging of the capacitor 12 of the voltage-boosting circuit 11. In detail, during transition from the hold value $I_{ev\_hold}$ to the zero-current value (second fall portion G), the inverted boosted voltage $-V_{BOOST}$ is applied across the electrovalve 5.

During this step, the highside and lowside transistors 38, 39 are set in an open condition, whilst the free-wheeling transistor 43 is set in a closed condition, and consequently the current flows in the loop comprising the free-wheeling transistor 43, the electrovalve 5, the boost diode 45, and the capacitor 12, which is in this way recharged. In fact, the energy stored in the electrovalve 5, equal to:

$$E_{ev} = \frac{1}{2} \cdot L_{ev} \cdot I_{ev\_hold}^2$$

is transferred into the capacitor 12, so that the energy $E_c$ stored in the capacitor 12 increases according to the relation:

$$\Delta E_C = \frac{1}{2} \cdot C \cdot (V_{BOOST}^2(t_4) - V_{BOOST}^2(t_3)) = E_{ev} = \frac{1}{2} \cdot L_{ev} \cdot I_{ev\_hold}^2$$

so that the boosted voltage $V_{BOOST}$ across it increases up to a value $V_{BOOST}(t_4)$ higher than the initial value $V_{BOOST}(t_3)$:

$$V_{BOOST}(t_4) = \sqrt{V_{BOOST}(t_3) + \frac{L_{ev}}{C} \cdot I_{ev\_hold}^2}$$

where $t_3$ (see also FIG. 4) is the instant at which discharge starts, and $t_4$ is the instant at which the current $I_{ev}$ in the electrovalve 5 reaches a zero value, and all the energy $E_{ev}$ has been transferred to the capacitor 12.

Since the value of the capacitance C of the capacitor 12 is rather high (about 1 mF), the increase of the boosted voltage $V_{BOOST}$ following turn-off of each electrovalve 5, calculated on the basis of the previous formula, is rather limited, so that sharp variations do not occur in the boosted voltage $V_{BOOST}$, which can thus be controlled accurately.

There clearly emerges the advantage of the solution proposed, given that the energy stored in the electrovalve 5, instead of being dissipated by the avalanche effect in the lowside transistor 39, is now transferred to the capacitor 12 of the voltage-boosting circuit 11, without any dissipative effect (apart from conduction losses), so contributing to recharging thereof.

Also during transition from the peak value $I_{ev\_peak}$ to the hold value $I_{ev\_hold}$ (first fall portion E), a further aspect of the present invention envisages transferring energy from the electrovalves 5 to the voltage-boosting circuit 11, so as to further increase the efficiency of recharging of the capacitor 12.

In detail, also during this step the highside and lowside transistors 38, 39 are set in an open condition, whilst the free-wheeling transistor 43 is set in a closed condition, so that the current flows in the loop comprising the free-wheeling transistor 43, the electrovalve 5, the boost diode 45, and the capacitor 12, which is in this way recharged. Across the electrovalve 5 there is present (but for the voltage drops on the diodes) the inverted boosted voltage $-V_{BOOST}$, and the current decreases rapidly from the peak value $I_{ev\_peak}$ to the hold value $I_{ev\_hold}$. Again, an increase of the energy stored in the capacitor 12 corresponds to the decrease in the magnetic energy in the electrovalve 5, according to the relation:

$$\Delta E_{ev} = \frac{1}{2} \cdot L_{ev} \cdot (I_{ev\_peak}^2 - I_{ev\_hold}^2) = \frac{1}{2} C \cdot (V_{BOOST}^2(t_2) - V_{BOOST}^2(t_1))$$

where $t_1$ is the instant at which there is a transition from the hold step to the discharge step (turning off the lowside transistor 39), and $t_2$ is the instant at which there is a transition again to the hold step (turning the lowside transistor 39 back on).

A possible variant of the described operation enables an even greater energy recovery towards the capacitor 12 to be achieved.

In detail, during transition from the peak value to the hold value, the lowside transistor 39 and the free-wheeling transistor 43 are turned off, whilst the highside transistor 38 is turned on. In this way, the current circulates in the loop comprising the supply source 8, the highside transistor 38, the electrovalve 5, the boost diode 45 and the capacitor 12, so that across the electrovalve 5 there is applied a voltage basically equal to $(V_{BATT}-V_{BOOST})$, and the current decreases rather rapidly from the peak value $I_{ev\_peak}$ to the hold value $I_{ev\_hold}$. In this way, the increase of the energy stored in the capacitor 12 corresponds not only to the decrease in the magnetic energy in the electrovalve 5, but also to the work performed by the supply source 8. The increase in the energy stored in the capacitor 12 can be expressed in this case by the following relation:

$$\frac{1}{2} C \cdot (V_{BOOST}^2(t_2) - V_{BOOST}^2(t_1)) =$$
$$\frac{1}{2} L_{ev} \cdot (I_{ev\_peak}^2 - I_{ev\_hold}^2) \cdot \left(1 + \frac{V_{BATT}}{V_{BOOST} - V_{BATT}}\right)$$

The energy recovery obtained with the operating method of the second control circuit 4 described previously is particularly efficient, so much so that in certain engine conditions there may occur an undesired increase in the boosted voltage $V_{BOOST}$. For example, said phenomenon may occur in the cut-off condition, i.e., in the case where there are no injections of fuel via the electro-injectors 3, but it is at the same time necessary to actuate the electrovalves 5, thus determining the previously described energy recovery.

To prevent the occurrence of said undesired increase, a further aspect of the present invention envisages that the measuring circuit 50 measures the value of the boosted voltage $V_{BOOST}$ across the capacitor 12 and transmits it to the timing circuit 9. When the measured value is higher than a given upper threshold, the timing circuit 9 drives the second control circuit 4 in such a way that at least during the transition from the peak value $I_{ev\_peak}$ to the hold value $I_{ev\_hold}$ of the current flowing in the electrovalves 5 there is no energy recovery to the capacitor 12.

The waveform of the current flowing in the electrovalves 5 is in this case the one illustrated in FIG. 5, where E' designates the fall portion decreasing from the peak value $I_{ev\_peak}$ to the hold value $I_{ev\_hold}$, which is different from what has been described with reference to FIG. 4.

In detail, during this step the highside transistor 38 is turned off, whilst the lowside transistor 39 and the free-wheeling transistor 43 are turned on, so that the current in the electrovalve 5 flows in the loop comprising the free-wheeling transistor 43, the electrovalve 5, and the lowside transistor 39. Across the electrovalve 5 there is a practically zero voltage (apart from the losses on the MOS transistors), so that the current decreases slowly from the peak value $I_{ev\_peak}$ to the hold value $I_{ev\_hold}$. In particular, the difference in magnetic energy $\Delta E_{ev}$ in the electrovalve 5, expressed by the relation:

$$\Delta E_{ev} = \frac{1}{2} \cdot L_{ev} \cdot (I_{ev\_peak}^2 - I_{ev\_hold}^2)$$

is dissipated thermally, instead of being recovered in the capacitor 12. In this way, the current that is brought back into the capacitor 12, causing recharging thereof, is only the one corresponding to the final step of actuation of the electrovalves 5 (transition of the current from the hold value $I_{ev\_hold}$ to the zero value, corresponding to the G portion of the curve).

In the event of this variant still not being sufficient to prevent the aforesaid undesired increase of the boosted voltage $V_{BOOST}$, a further aspect of the present invention envisages the introduction of an additional discharge step in the operation of the first control circuit 2, distinct from the previously described steps of fast-charge, hold, fast-discharge (regarding fuel injection), and recharge. In particular, said discharge step is activated by the timing circuit 9 when the measured value of the boosted voltage $V_{BOOST}$ is higher than the given upper threshold.

In detail, during the discharge step, the timing circuit 9 first identifies the electro-injectors 3 not involved at that given instant in a fuel injection, and then commands its activation, determining discharge pulses. Clearly, as has already been described for the recharge step, the maximum level $I'_{inj\_max}$ reached by the current flowing in each electro-injector 3 must be such as not to cause opening of the electro-injector 3 and thus fuel injection within the cylinders. The discharge pulses can be issued simultaneously in all the electro-injectors 3 not involved in fuel injection and be interrupted as soon as the boosted voltage $V_{BOOST}$ again drops below a given lower threshold.

Figure 6:
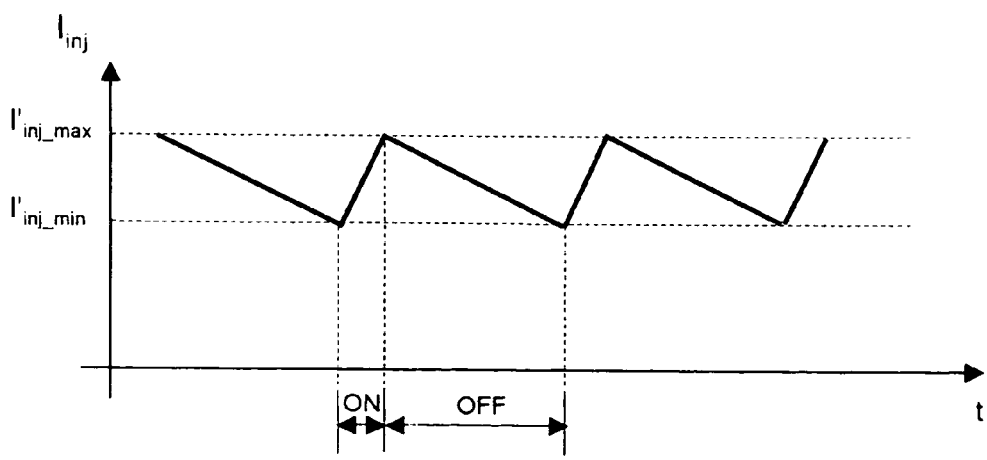

The discharge pulses (the pattern of which is illustrated in FIG. 6 in a given time window), have a periodic pattern, characterized by the alternation of an ON step and an OFF step.

During the ON step, the boost transistor 22, the highside transistor 24, and the lowside transistor 25 are turned on simultaneously, so that the current flows in the loop comprising the capacitor 12, the boost transistor 22, the highside transistor 24, the electro-injector 3, the lowside transistor 25, and the sense resistor 26. In this step, the boosted voltage $V_{BOOST}$ is applied on the electro-injector 3, and thus the current increases rapidly with a slope equal to $V_{BOOST}/L_{inj}$ and the capacitor 12 is partially discharged, transferring part of the energy accumulated therein to the electro-injector 3. The ON step terminates as soon as the current, measured through the sense resistor 26, reaches the given upper value $I'_{inj\_max}$.

During the OFF step, the highside transistor 24 is turned off, whilst the lowside transistor 25 remains on, so that the current flows in the loop comprising the free-wheeling diode 28, the electro-injector 3, the lowside transistor 25, and the sense resistor 26. In this step, a substantially zero voltage (but for the voltage drop on the free-wheeling diode 28) is applied on the electro-injector 3, and the current decreases in an approximately exponential way with a time constant $\tau$ equal to:

$$\tau = \frac{L_{inj}}{R_{inj} + R_s + R_{wires}}$$

where $R_s$ is the resistance of the sense resistor 26, $R_{inj}$ is the equivalent resistance of the electro-injector 3, whilst $R_{wires}$ is a resistive term taking into account the dissipation on the wires, on the paths of the printed circuit whereon the device is made, on the lowside transistor 25, etc. In particular, it should be emphasized that the magnetic energy stored in the electro-injector at the end of the ON step is partially dissipated in the form of heat, principally on the wiring and on the electro-injector 3, and so externally to the engine control unit.

The OFF step terminates when the current circulating in the electro-injector 3 assumes a minimum given value $I'_{inj\_min}$, which is also measured via the sense resistor 26.

Via repetition of the two ON and OFF steps described previously, it is therefore possible to obtain partial discharging of the capacitor 12, so as to prevent the undesired increase of the boosted voltage $V_{BOOST}$.

The advantages of the present invention will be clear from the foregoing description.

In particular, the single control device enables marked limitation of the power dissipation in the engine control unit. In fact, it eliminates the losses of power by the avalanche effect in the lowside transistors of the circuit for controlling the electrovalves, in so far as the power stored in the electrovalves is transferred into the capacitor of the voltage-boosting circuit, but for the conduction losses (largely external to the control unit).

The MOSFET transistors can thus be sized on the basis of just the conduction losses, and consequently have a smaller package, be less costly, and render integration of all the control circuits within the engine control unit simpler.

Furthermore, the boosted voltage necessary for driving the electro-injectors during their opening (fast-charge step)

is generated more efficiently. In fact, part of the energy stored in the electrovalves during their normal actuation is used to recharge the boost capacitor.

Finally, it is clear that modifications and variations may be made to what is described and illustrated herein, without thereby departing from the scope of the present invention, as defined in the appended claims.

In particular, it is clear that the circuit structure described for the single device for controlling electro-injectors and electrovalves is altogether general, since it may comprise any number whatsoever of circuits for controlling electro-injectors and electrovalves, according to the number of cylinder banks of which the engine is constituted, the number of cylinders per cylinder bank, as well as the number of electro-injectors and electrovalves per cylinder.

Furthermore, it is clear that the described circuit structure may comprise any electrovalve within the engine that does not require for its activation a boosted voltage, without thereby being limited to electrovalves for controlling intake valves and/or exhaust valves.

Finally, the single control device described is applicable also in petrol engines equipped with a direct injection system (Gasoline Direct Injection—GDI), or, in general, in any engine in which there are electro-injectors requiring for their activation a boosted voltage higher than the battery voltage.

The invention claimed is:

1. A device for controlling electro-injectors and electrovalves in an internal-combustion engine, said device comprising a first control circuit for each electro-injector and a second control circuit for each electrovalve; wherein each first control circuit comprises a first input terminal and a second input terminal, configured to be connected, in certain given operating conditions, to a first source of electrical energy supplying a first voltage ($V_{BATT}$), and, in other given operating conditions, to a second source of electrical energy, supplying a second voltage ($V_{BOOST}$) higher than the first voltage ($V_{BATT}$) and comprising energy-accumulation means, a first output terminal, and a second output terminal, said terminals being configured to be connected, in use, to the respective electro-injector, and first switch means configured to connect the respective electro-injector to said first source of electrical energy in certain given operating conditions and to said energy-accumulation means in certain other given operating conditions; and wherein each second control circuit comprises a first input terminal and a second input terminal configured to be connected, in use, to said first source of electrical energy, a first output terminal and a second output terminal, configured to be connected, in use, to the respective electrovalve, and second switch means, configured to connect the respective electrovalve to said first source of electrical energy in certain given operating conditions; said device being characterized in that said second switch means are further configured to connect the respective electrovalve to said energy-accumulation means in certain other given operating conditions, for transferring the electrical energy accumulated in the electrovalve to said energy-accumulation means.

2. The device according to claim 1, wherein each of said first and second switch means comprise:
first controlled switch means connected between said first output terminal and said first input terminal;
second controlled switch means connected between said second output terminal and said second input terminal;
first unidirectional-conduction means, connected between said first output terminal and said second input terminal; and
second unidirectional-conduction means connected between said second output terminal and said second source of electrical energy.

3. The device according to claim 2, further comprising a timing circuit, configured to supply timing signals to said first and second control circuits; said timing circuit being further configured to control, during an accumulation step, closing of said first and second controlled switch means of said second switch means for defining a current path through said first source of electrical energy, said first and second controlled switch means and said electrovalve, so as to store electrical energy in said electrovalve; and, during a step of transfer subsequent to said accumulation step, opening of said first and second controlled switch means of said second switch means for defining a current path through said electrovalve, said first and second unidirectional-conduction means and said energy-accumulation means, so as to transfer the electrical energy accumulated in said electrovalve to said energy-accumulation means.

4. The device according to claim 2, further comprising a timing circuit, configured to supply timing signals to said first and second control circuits; said timing circuit being further configured to control, during an accumulation step, closing of said first and second controlled switch means of said second switch means for defining a current path through said first source of electrical energy, said first and second controlled switch means and said electrovalve so as to store electrical energy in said electrovalve; and, during a step of transfer subsequent to said accumulation step, closing of said first controlled switch means and opening of said second controlled switch means of said second switch means for defining a current path through said first source of electrical energy, said first controlled switch means, said electrovalve, said second unidirectional-conduction means, and said electrical-energy-accumulation means, so as to transfer the energy accumulated in said electrovalve and the work performed by said first source of electrical energy to said energy-accumulation means.

5. The device according to claim 3, wherein said timing circuit is configured to control said second switch means in such a way that the current flowing in said electrovalve increases from an initial value to a first hold value ($I_{ev\_bias}$) and from the first hold value to a peak value ($I_{ev\_peak}$), and then decreases from the peak value to a second hold value ($I_{ev\_hold}$), and from the second hold value to a final value; and wherein said step of transfer corresponds to the decrease of the current from the second hold value ($I_{ev\_hold}$) to the final value.

6. The device according to claim 5, wherein said step of transfer further corresponds to the decrease of the current flowing in said electrovalve from the peak value ($I_{ev\_peak}$) to the second hold value ($I_{ev\_hold}$).

7. The device according to claim 6, further comprising measuring means, connected to said energy-accumulation means for measuring said second voltage ($V_{BOOST}$); and wherein said timing circuit is connected to said measuring means and is configured to control said second switch means so as to interrupt the transfer of the energy accumulated in said electrovalve to said energy-accumulation means during decrease of the current from the peak value ($I_{ev\_peak}$) to the second hold value ($I_{ev\_hold}$) when said second voltage ($V_{BOOST}$) exceeds a given upper limit.

8. The device according to claim 7, wherein, during decrease of the current from the peak value ($I_{ev\_peak}$) to the second hold value ($I_{ev\_hold}$) said timing circuit is configured to control opening of said first controlled switch means and closing of said second controlled switch means of said second switch means.

9. The device according to claim 2, further comprising a timing circuit, configured to supply timing signals to said first and second control circuits, and measuring means, connected to said energy-accumulation means for measuring said second voltage ($V_{BOOST}$); and wherein said timing circuit is connected to said measuring means and is configured to control said first switch means so as to transfer part of the energy accumulated in said energy-accumulation means into at least one of the electro-injectors not involved in a fuel injection, when said second voltage ($V_{BOOST}$) exceeds a given upper limit, so as to discharge said energy-accumulation means.

10. The device according to claim 9, wherein said timing circuit is configured to control said first switch means so as to connect alternately said electro-injector not involved in a fuel injection to said second source of electrical energy and to a zero voltage.

11. The device according to claim 4, wherein said timing circuit is configured to control said second switch means in such a way that the current flowing in said electrovalve increases from an initial value to a first hold value ($I_{ev\_bias}$) and from the first hold value to a peak value ($I_{ev\_peak}$), and then decreases from the peak value to a second hold value ($I_{ev\_hold}$), and from the second hold value to a final value; and wherein said step of transfer corresponds to the decrease of the current from the second hold value ($I_{ev\_hold}$) to the final value.

12. The device according to claim 3, further comprising a timing circuit, configured to supply timing signals to said first and second control circuits, and measuring means, connected to said energy-accumulation means for measuring said second voltage ($V_{BOOST}$); and wherein said timing circuit is connected to said measuring means and is configured to control said first switch means so as to transfer part of the energy accumulated in said energy-accumulation means into at least one of the electro-injectors not involved in a fuel injection, when said second voltage ($V_{BOOST}$) exceeds a given upper limit, so as to discharge said energy-accumulation means.

13. The device according to claim 4, further comprising a timing circuit, configured to supply timing signals to said first and second control circuits, and measuring means, connected to said energy-accumulation means for measuring said second voltage ($V_{BOOST}$); and wherein said timing circuit is connected to said measuring means and is configured to control said first switch means so as to transfer part of the energy accumulated in said energy-accumulation means into at least one of the electro-injectors not involved in a fuel injection, when said second voltage ($V_{BOOST}$) exceeds a given upper limit, so as to discharge said energy-accumulation means.

14. The device according to claim 5, further comprising a timing circuit, configured to supply timing signals to said first and second control circuits, and measuring means, connected to said energy-accumulation means for measuring said second voltage ($V_{BOOST}$); and wherein said timing circuit is connected to said measuring means and is configured to control said first switch means so as to transfer part of the energy accumulated in said energy-accumulation means into at least one of the electro-injectors not involved in a fuel injection, when said second voltage ($V_{BOOST}$) exceeds a given upper limit, so as to discharge said energy-accumulation means.

15. The device according to claim 6, further comprising a timing circuit, configured to supply timing signals to said first and second control circuits, and measuring means, connected to said energy-accumulation means for measuring said second voltage ($V_{BOOST}$); and wherein said timing circuit is connected to said measuring means and is configured to control said first switch means so as to transfer part of the energy accumulated in said energy-accumulation means into at least one of the electro-injectors not involved in a fuel injection, when said second voltage ($V_{BOOST}$) exceeds a given upper limit, so as to discharge said energy-accumulation means.

16. The device according to claim 7, further comprising a timing circuit, configured to supply timing signals to said first and second control circuits, and measuring means, connected to said energy-accumulation means for measuring said second voltage ($V_{BOOST}$); and wherein said timing circuit is connected to said measuring means and is configured to control said first switch means so as to transfer part of the energy accumulated in said energy-accumulation means into at least one of the electro-injectors not involved in a fuel injection, when said second voltage ($V_{BOOST}$) exceeds a given upper limit, so as to discharge said energy-accumulation means.

17. The device according to claim 8, further comprising a timing circuit, configured to supply timing signals to said first and second control circuits, and measuring means, connected to said energy-accumulation means for measuring said second voltage ($V_{BOOST}$); and wherein said timing circuit is connected to said measuring means and is configured to control said first switch means so as to transfer part of the energy accumulated in said energy-accumulation means into at least one of the electro-injectors not involved in a fuel injection, when said second voltage ($V_{BOOST}$) exceeds a given upper limit, so as to discharge said energy-accumulation means.

18. A method of operating a device for controlling electro-injectors and electrovalves in an internal-combustion engine comprising:

providing said device comprising a first control circuit for each electro-injector and a second control circuit for each electrovalve; wherein said first control circuit comprises a first input terminal and a second input terminal, configured to be connected, in certain given operating conditions, to a first source of electrical energy supplying a first voltage ($V_{BATT}$), and, in other given operating conditions, to a second source of electrical energy, supplying a second voltage ($V_{BOOST}$) higher than the first voltage ($V_{BATT}$) and an energy-accumulation means, a first output terminal, and a second output terminal, said terminals being configured to be connected, in use, to the respective electro-injector; and wherein each second control circuit comprises a first input terminal and a second input terminal configured to be connected, in use, to said first source of electrical energy, a first output terminal and a second output terminal, configured to be connected, in use, to the respective electrovalve, providing a first switch means configured to connect an electro-injector to a first source of electrical energy;

providing a second switch means, configured to connect an electrovalve to said first source of electrical energy;

controlling said second switch means so as to connect the respective electrovalve to said first source of electrical energy in a certain given operating condition, for accumulating energy in said electrovalve;

controlling said second switch means so as to connect the respective electrovalve to said energy-accumulation means in said certain other given operating condition, for transferring the electrical energy accumulated in said electrovalve to an energy-accumulation means.

19. The method according to claim 18, wherein each of said first and said second switch means include a first controlled switch means connected between said first output terminal and said first input terminal, a second controlled switch means connected between said second output terminal and said second input terminal, a first unidirectional-conduction means, connected between said first output terminal and said second input terminal, and a second unidirectional-conduction means connected between said second output terminal and said second source of electrical energy;

wherein connecting the respective electrovalve to said first source of electrical energy comprises:

closing the first and second controlled switch means of the respective second control circuit for defining a current path through said first source of electrical energy, said first and second controlled switch means and said electrovalve so as to actuate the electrovalve and at the same time accumulate electrical energy in the electrovalve;

and wherein connecting the respective electrovalve to the energy-accumulation means comprises:

opening said first and second controlled switch means of the respective second control circuit for defining a current path through said electrovalve, said first and second unidirectional-conduction means and said energy-accumulation means so as to transfer the electrical energy accumulated in said electrovalve during actuation thereof to said energy-accumulation means.

20. The method according to claim 18, wherein said step of connecting the respective electrovalve to said first source of electrical energy comprises:

closing the first and second controlled switch means of the respective second control circuit for defining a current path through said first source of electrical energy, said first and second controlled switch means, and said electrovalve so as to actuate the electrovalve and at the same time accumulate electrical energy in the electrovalve;

and wherein connecting the respective electrovalve to the energy-accumulation means further comprises closing said first controlled switch means and opening said second controlled switch means of the respective second control circuit for defining a current path through said first source of electrical energy, said first controlled switch means, said electrovalve, said second unidirectional-conduction means, and said electrical-energy-accumulation means so as to transfer the energy accumulated in said electrovalve during actuation thereof and the work performed by said first source of electrical energy to said energy-accumulation means.

21. The method according to claim 19, comprising the step of controlling said second switch means in such a way that the current flowing in said electrovalve increases from an initial value to a first hold value ($I_{ev\_bias}$) and from the first hold value to a peak value ($I_{ev\_peak}$), and then decreases from the peak value to a second hold value ($I_{ev\_hold}$), and from the second hold value to a final value; and wherein said step of connecting the respective electrovalve to said energy-accumulation means corresponds to the decrease of the current from the second hold value ($I_{ev\_hold}$) to the final value.

22. The method according to claim 21, wherein connecting the respective electrovalve to said energy-accumulation means further corresponds to the decrease of the current from the peak value ($I_{ev\_peak}$) to the second hold value ($I_{ev\_hold}$).

23. The method according to claim 22, further comprising:

measuring said second voltage ($V_{BOOST}$); and controlling said second switch means so as to interrupt the transfer of the energy accumulated in said electrovalve to said energy-accumulation means during decrease of the current from the peak value ($I_{ev\_peak}$) to the second hold value ($I_{ev\_hold}$) when said second voltage ($V_{BOOST}$) exceeds a given upper limit.

24. The method according to claim 23, wherein interrupting the transfer of the energy accumulated in said electrovalve to said energy-accumulation means comprises opening said first controlled switch means and closing said second controlled switch means of the respective second control circuit.

25. The method according to claim 19, further comprising:

measuring said second voltage ($V_{BOOST}$); and controlling said first switch means so as to transfer part of the energy accumulated in said energy-accumulation means into at least one of the electro-injectors not involved in a fuel injection, when said second voltage ($V_{BOOST}$) exceeds a given upper limit, so as to discharge said energy-accumulation means.

26. The method according to claim 25, wherein transferring part of the energy accumulated in said energy-accumulation means into at least one of the electro-injectors not involved in a fuel injection comprises the step of controlling said first switch means so as to connect, alternately, said electro-injector not involved in a fuel injection to said second source of electrical energy and to a zero voltage.

27. The method according to claim 20, comprising the step of controlling said second switch means in such a way that the current flowing in said electrovalve increases from an initial value to a first hold value ($I_{ev\_bias}$) and from the first hold value to a peak value ($I_{ev\_peak}$), and then decreases from the peak value to a second hold value ($I_{ev\_hold}$), and from the second hold value to a final value; and wherein said step of connecting the respective electrovalve to said energy-accumulation means corresponds to the decrease of the current from the second hold value ($I_{ev\_hold}$) to the final value.

28. The method according to claim 20, further comprising:

measuring said second voltage ($V_{BOOST}$); and controlling said first switch means so as to transfer part of the energy accumulated in said energy-accumulation means into at least one of the electro-injectors not involved in a fuel injection, when said second voltage ($V_{BOOST}$) exceeds a given upper limit, so as to discharge said energy-accumulation means.

29. The method according to claim 21, further comprising:

measuring said second voltage ($V_{BOOST}$); and controlling said first switch means so as to transfer part of the energy accumulated in said energy-accumulation means into at least one of the electro-injectors not involved in a fuel injection, when said second voltage ($V_{BOOST}$) exceeds a given upper limit, so as to discharge said energy-accumulation means.

30. The method according to claim 22, further comprising:
  measuring said second voltage ($V_{BOOST}$); and
  controlling said first switch means so as to transfer part of the energy accumulated in said energy-accumulation means into at least one of the electro-injectors not involved in a fuel injection, when said second voltage ($V_{BOOST}$) exceeds a given upper limit, so as to discharge said energy-accumulation means.

31. The method according to claim 23, further comprising:
  measuring said second voltage ($V_{BOOST}$); and
  controlling said first switch means so as to transfer part of the energy accumulated in said energy-accumulation means into at least one of the electro-injectors not involved in a fuel injection, when said second voltage ($V_{BOOST}$) exceeds a given upper limit, so as to discharge said energy-accumulation means.

32. The method according to claim 24, further comprising:
  measuring said second voltage ($V_{BOOST}$); and
  controlling said first switch means so as to transfer part of the energy accumulated in said energy-accumulation means into at least one of the electro-injectors not involved in a fuel injection, when said second voltage ($V_{BOOST}$) exceeds a given upper limit, so as to discharge said energy-accumulation means.

* * * * *